United States Patent [19]
Ogita

[11] 4,037,165
[45] July 19, 1977

[54] SYNCHRONOUS SIGNAL GENERATING SYSTEM WITH PHASE-LOCKED LOOP CIRCUIT

[75] Inventor: Minoru Ogita, Hamamatsu, Japan

[73] Assignee: Nippon Gakki Seizo Kabushiki Kaisha, Hamamatsu, Japan

[21] Appl. No.: 672,629

[22] Filed: Mar. 31, 1976

[30] Foreign Application Priority Data

Apr. 1, 1975  Japan .................................. 50-38557

[51] Int. Cl.² ............................................. H03D 3/00
[52] U.S. Cl. ........................... 329/124; 179/15 BT; 325/346; 329/168; 331/23; 331/25
[58] Field of Search ............... 329/122, 124, 125, 112, 329/168-173; 331/18, 19, 23, 24, 25; 325/346, 419; 179/15 BT

[56] References Cited

U.S. PATENT DOCUMENTS 3,873,931  3/1975  Basse et al. ..................... 329/122

*Primary Examiner*—Siegfried H. Grimm
*Attorney, Agent, or Firm*—Cushman, Darby & Cushman

[57] ABSTRACT

A composite signal consisting of a plurality of signals of different frequencies is applied via a cancelling circuit to a phase-locked loop circuit which is adapted to be locked with a certain signal contained in the composite signal to generate a signal synchronous with this certain signal. A cancelling signal generated from a cancelling signal generating circuit is applied, in addition to the composite signal, to the cancelling circuit when the phase-locked loop circuit is in the locked state, thereby cancelling, by this cancelling signal, those signals contained in the composite signal other than the certain signal. Thus, only the certain signal is inputted from the cancelling circuit to the phase-locked loop circuit when the latter is in the locked state.

6 Claims, 9 Drawing Figures

SYNCHRONOUS SIGNAL GENERATING SYSTEM WITH PHASE-LOCKED LOOP CIRCUIT

BACKGROUND OF THE INVENTION a. Field of the Invention

The present invention relates to a synchronous signal generating system intended to generate a synchronous signal which is synchronous with a certain signal contained in a composite signal consisting of a plurality of signals, and more particularly it pertains to such a system including, as its main part, the so-called "phase-locked loop circuit."

b. Description of the Prior Art

There are many cases in the electronics industries wherein it is required to obtain a synchronous signal which is exactly synchronized with a certain signal contained in a composite signal consisting of plurality of signals with different frequencies. As an example of such cases, description will hereunder be made of the production of an FM-stereo broadcast.

Modern FM-stereo broadcasting is conducted by a suppressed carrier AM-FM modulation system which is called a pilot-tone system which in turn is a modification of the suppressed carrier modulation system. FM-stereo receivers for receiving such an FM-stero broadcast and reproducing the stereophonic sounds are designed so that the broadcast wave received is FM-demodulated by an FM-detector into a composite signal consisting of a main-channel signal, a sub-channel signal and a pilot signal (19kHz), and this composite signal is then demodulated or separated by a stereo demodulator into audio signals of the left and the right channels.

The stero demodulator mentioned above is adapted to receive a carrier wave (38kHz) in addition to the main- and the sub-channel signals, for the demodulation of the composite signal. This carrier wave, which must be exactly synchronized with the sub-carrier wave (38kHz) used for the modulation of the sub-channel signal (the differential signal of the left-and the right-channel audio signals) conducted at the broadcasting station, is generated in the receiver and based on the pilot signal (19kHz) received for the sake of the generation of the carrier wave in the receiver.

In some conventional FM-stereo receivers, the so-called phase-locked loop circuit is provided for generating a carrier wave. The phase-locked loop circuit, in principle, comprises a voltage-controlled oscillator (VCO) which is capable of controlling the oscillation frequency by the control voltage applied thereto, and a phase detecting circuit which receives the composite signal containing the pilot signal (19kHz) and the output signal derived from the VCO and which thereby delivers a DC voltage having a magnitude proportional to the phase difference between the pilot signal and the output signal of the VCO, which DC voltage is applied, as the control signal, to the VCO so that the output signal of the VCO is synchronized (locked) with the pilot signal. Thus, at the output terminal of the VCO is obtained a synchronous signal which is synchronous with the pilot signal. In general, the phase-locked loop circuit further comprises a frequency divider and is arranged so that the output of the VCO is applied via the frequency divider to the phase detecting circuit for allowing the output signal of the VCO to be used, as it is, as the carrier wave (38kHz) having a frequency just twice that of the pilot signal (19kHz).

In FIG. 1 is shown an example of a synchronous signal (carrier wave) generating system according to the prior art, which includes a phase-locked loop circuit 1 and a lock-detecting circuit 8.

The phase-locked loop circuit comprises: a phase detecting circuit consisting of a phase detector 2 and a low-pass filter 3 assigned for filtering the output signal of the phase detector 2; a DC-amplifier 4 for amplifying the DC-voltage derived from the low-pass filter 3; a voltage-controlled oscillator 5 designed to oscillate at a frequency nearly four times the frequency of the pilot signal (19kHz) of the composite signal applied to the input terminal IN; and frequency dividers 6 and 7 through which the output of the voltage-controlled oscillator 4 is fed back to the phase detector 2. By the DC-amplifier's output which corresponds to the DC-voltage derived from the low-pass filter 3 of the phase detecting circuit, the oscillation frequency or the phase of the voltage-controlled oscillator 5 is controlled in such a manner that the phase difference between the pilot signal and the output signal of the frequency divider 7 both applied to the phase detector 2 is kept at 90°. Thus, at the output terminal of the frequency divider 6 is derived a synchronous signal of a constant amplitude which is synchronous with the pilot signal and which is of a frequency exactly twice the frequency of the pilot signal. That is, the output signal of the frequency divider 6 can be used as the carrier wave for the demodulation of the composite signal into the left- and the right-channel audio signals.

With the prior art arrangement of the phase-locked loop circuit 1 mentioned above, however, if the levels of the main-and the sub-channel signals of the composite signal are excessively high, these signal components leak, after passing through the low-pass filter 3 and the DC-amplifier 4, to the voltage-controlled oscillator 5, so that the oscillation frequency of the voltage-controlled oscillator is caused to adversely fluctuate by these leaking signal components. This results in a poor stability of the phase of the synchronous signal generated at the output OUT. It should be noted therefore that, for the purpose of preventing such undesirable phase-fluctuation, the permissible level of the composite signal inputted to the phase-locked loop circuit 1 has in the past been kept at a considerably narrow range and also the capture frequency range of the phase-locked loop circuit 1 has been limited within a narrow range.

Referring again to FIG. 1, the lock-detecting circuit 8 is provided in order to indicate, on an indicator 13, whether the phase-locked loop circuit 1 is in the locked state or in the unlocked state. This circuit 8 includes a synchronous detector circuit consisting of a phase detector 9 and a low-pass filter 10, a DC-amplifier 11, and a frequency divider 12. When the phase-locked loop circuit 1 is in the state of being locked with the pilot signal of the composite signal, the frequency divider 12 receives from the frequency divider 6 a signal having a frequency exactly twice the frequency of the pilot signal, and then delivers to the phase detector 9 a signal having the same frequency as that of the pilot signal and being in phase with the pilot signal of the composite signal. As a result, a DC voltage of a magnitude proportional to the level of the pilot signal applied to the phase detector 9 is delivered from the low-pass filter and it is inputted to the DC-amplifier, and thus the indicator 13 is lit up by the output of the DC-amplifier 11. In the unlocked state of the phase-locked loop circuit 1, since the output of the frequency divider 12 is out of phase with the pilot signal and since no DC-voltage is delivered from the synchronous detector circuit, the indicator 13 is turned off.

SUMMARY OF THE INVENTION

It is, therefore, a primary object of the present invention to provide a synchronous signal generating system employing, as its mainpart, the so-called phase-locked loop circuit, which is capable of generating synchronous signal which is exactly synchronous with a certain signal of a composite signal consisting of a plurality of signals with different frequencies.

Another object of the present invention is to provide a synchronous signal generating system of the type described, which generates a synchronous signal whose phase characteristic is highly stable even in case the level of the composite signal applied thereto is excessively high.

Still another object of the present invention is to provide a synchronous signal generating system of the type described, which can provide a considerably wide capture range (locking frequency range) therefor as compared with a prior art phase-locked loop circuit.

According to the present invention, there is provided a system for generating a synchronous signal which is synchronous with a first signal contained in a composite signal consisting of said first signal and at least one second signal of a frequency different from that of said first signal, comprising: a phase-locked loop circuit which, upon its receipt of at least said first signal through a first means, is locked with said first signal received and which thereby generates said synchronous signal; and a second means for receiving at least said composite signal and for thereby generating a cancelling signal, said first means receiving said composite signal and said cancelling signal to thereby cancel, by said cancelling signal, said second signal contained in said composite signal, whereby said first signal carrying substantially none of said second signal is delivered from said first means to said phase-locked loop circuit.

Accordingly, a further object of the present invention is to provide such a cancelling signal generating means and a cancelling means.

These and other objects as well as the features of the present invention will become apparent by reading the following detailed description of the present invention when taken in conjunction with the accompanying drawings.

BRIEF DESCRIPTION OF THE DRAWINGS

Like parts are indicated by like reference symbols and numerals throughout the drawings.

DETAILED DESCRIPTION OF THE PREFERRED EMBODIMENTS

Figure 1:
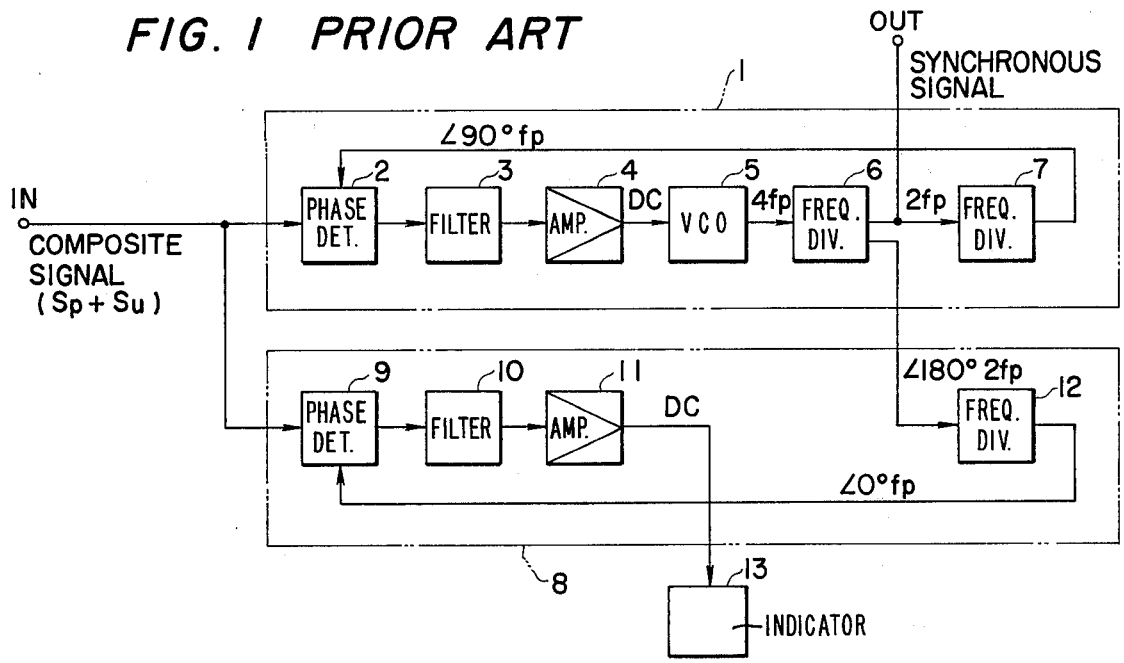
FIG. 1 is a circuit diagram showing an example of the synchronous generating system of the prior art.
Figure 2:
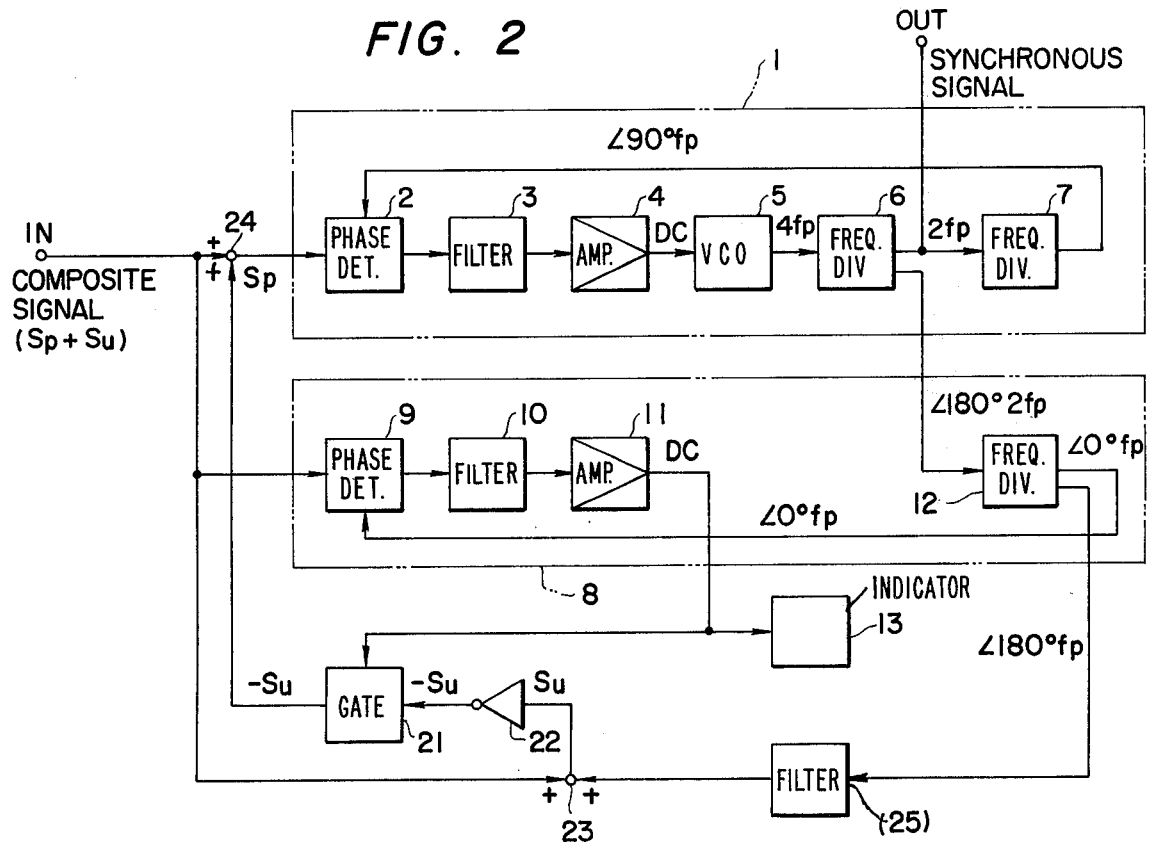
FIG. 2 is a circuit diagram showing an example of a synchronous signal generating system according to the present invention.

With reference to FIG. 2, description will be made of an example of a synchronous signal generating system of the present invention. This synchronous signal generating system is composed of a phase-locked loop circuit 1, a lock-detecting circuit 8, a cancelling signal generating means consisting of a gate 21, a phase inverter 22 and an adder 23, and a cancelling means including an adder 24. The phase-locked loop circuit 1 and the lock-detecting circuit 8 are similar in arrangement to those of FIG. 1, and therefore the detailed description about these circuits 1 and 8 is omitted here.

To an input terminal IN is inputted a composite signal consisting of a first signal $S_p$ of a frequency $f_p$ and a single or plural second signal(s) $S_u$ of frequencies different from the frequency $f_p$. In an FM-stereo receiver, for instance, the first signal $S_p$ corresponds to the pilot signal (19kHz), the second signals $S_u$ corresponding to the main- and the sub-channel signals.

The cancelling signal generating means is assigned to generate a cancelling signal $-S_u$ corresponding to the phase-inverted signal(s) of the second signal(s) $S_u$ of the composite signal, only when the phase-locked loop circuit 1 is in the locked state relative to the first signal $S_p$ of the composite signal applied to the input terminal IN. The cancelling means or the adder 24 functions so that, when the phase-locked loop circuit 1 is in the locked state and accordingly the cancelling signal $-S_u$ is delivered from the cancelling signal generating means, it conducts the addition of the composite signal to the cancelling signal $-S_u$ to thereby cancel the second signal(s) $S_u$ contained in the composite signal by the cancelling signal. Thus, the composite signal hardly contains the second signal(s) $S_u$ therein. In other words, only the first signal $S_p$ is inputted to the phase-locked loop circuit 1.

The operation of the synchronous signal generating system according to the present invention will hereunder be explained in further detail.

In case the phase-locked loop circuit 1 is in the unlocked state relative to the first signal $S_p$ of the composite signal, no DC-voltage is applied from the DC-amplifier 11 of the lock-detecting circuit 8 to the gate 21 of the cancelling signal generating circuit, so that the gate remains closed and does not deliver the cancelling signal $-S_u$ to the adder 24. Accordingly, the composite signal applied to the input terminal IN is fed, as it is, to the phase-locked loop circuit 1. Under this condition, the phase-locked loop circuit 1 operates in the same manner as described in FIG. 1 to thereby become locked with the first signal $S_p$ of the composite signal.

When the phase-locked loop circuit 1 is brought into the locked state, the frequency divider 12 generates a rectangular pulse signal of the frequency $f_p$ which is synchronized with the first signal $S_p$ and whose phase is inverse of that of the first signal $S_p$, and the DC-amplifier 11 produces a DC-voltage at its output terminal. The pulse signal which is derived from the frequency divider 12 and also the composite signal are added to each other by the adder 23, and the resulting signal is applied, after being phase-inverted through the phase inverter 22, to the gate 21. Since the gate is now rendered open by the DC-voltage derived from the DC-amplifier 11, said phase-inverted signal will be applied, as the cancelling signal, to the adder 24 through the conducting gate 21.

It will be understood that, if the frequency divider 12 is designed so that said pulsive signal delivered from the frequency divider has a root mean square value (r.m.s.) which is substantially equal to that of the first signal $S_p$, the first signal $S_p$ component of the composite signal is almost perfectly cancelled by this pulsive signal through the addition conducted at the adder 23, with the result that to the adder 24 is applied the phase-inverted second signal $-S_u$ delivered from the gate 21. Consequently, the second signal $S_u$ contained in the composite signal applied to the adder 24 is cancelled at the adder 24 by said cancelling signal, and only the first signal $S_p$ is inputted to the phase-locked loop circuit 1. Thus, once the phase-locked loop circuit 1 has been brought into the locked state relative to the first signal $S_p$, the second signal(s) $S_u$ of the composite signal is substantially not inputted to the phase-locked loop circuit 1. It will be understood therefore that, according to the present invention, even if the composite signal or a noise of an excessive high level is applied to the input terminal IN, there arises no phase-fluctuation of the synchronous signal generated at the synchronous signal generating system. In other words, the synchronous signal generating system according to the present invention may be inputted with the composite signal of a higher level as compared with the conventional similar system without the fear of any harm, and also it may be designed so as to provide a considerably wide capture range therefor.

In the above description, the pulsive signal derived from the frequency divider 12 is applied, as it is, to the adder 23. It should be appreciated, however, that in case the first signal $S_p$ is a sinusoidal wave, it is preferred to provide such a resonant band-pass filter 25 (indicated by a dotted line in FIG. 2) as having a resonance frequency equal to the frequency $f_p$ of the first signal $S_p$ in the signal path leading from the frequency divider to the adder 23. In this case, the pulsive signal is converted through the resonant band-pass filter 25 into a signal of a sinusoidal wave like the first signal $S_p$ and then it is applied to the adder 23. Thus, it is possible to perfectly cancel, at the adder 23, the first signal $S_p$ component of the composite signal by the sinusoidal signal, with the result that an ideal cancelling signal which is to be applied to the adder 24 is obtained from the cancelling signal generating circuit.

Figure 3A:
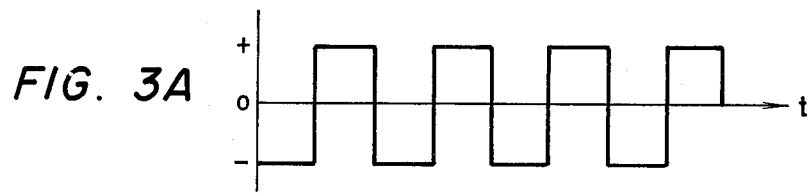
FIGS. 3A, 3B, 3C and 3D are charts respectively showing the waveforms of the signals at several points in the system of FIG. 2.
Figure 3B:
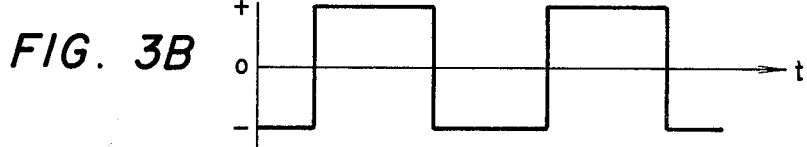
Figure 3C:
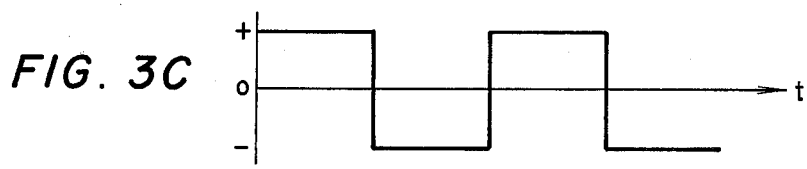
Figure 3D:
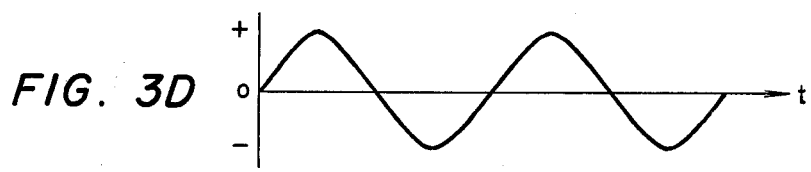

In FIGS. 3A, 3B, 3C and 3D are shown the exemplary wave forms of the signals at the respective points in the synchronous signal generating system of FIG. 2 when the phase-locked loop circuit 1 is in the locked state. FIG. 3A shows the waveform of the signal at the output OUT; FIG. 3B the waveform of the output signal of the frequency divider 7; FIG. 3C the waveform of the output signal of the frequency divider 12; and FIG. 3D the waveform of the first signal $S_p$.

Figure 4:
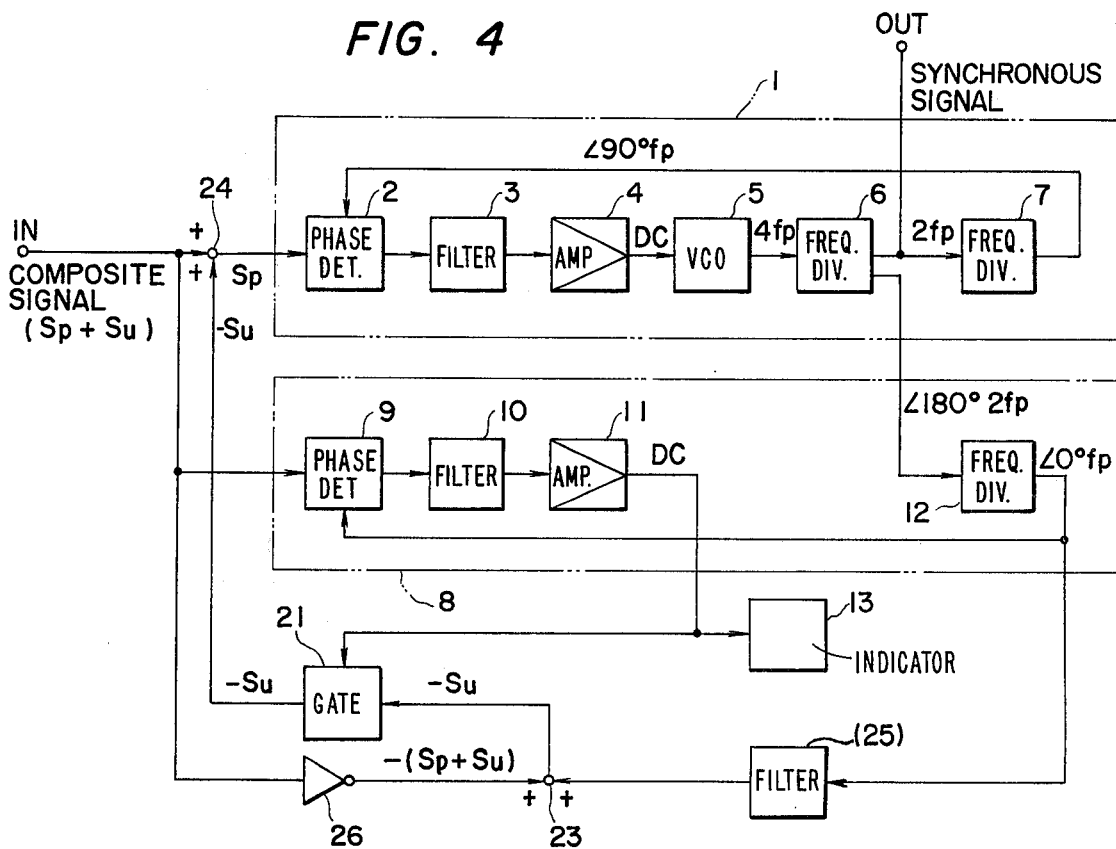
FIGS. 4, 5 and 6 are circuit diagrams showing other examples of a synchronous signal generating system according to the present invention.

In FIG. 4 is shown another example of a synchronous signal generating system according to the present invention. The difference between this embodiment and the previous embodiment shown in FIG. 2 is found in the arrangement of the cancelling signal generating circuit. In this embodiment, the cancelling signal generating circuit is composed of a phase-inverter 26, an adder 23 and a gate 21. To the adder 23 are applied the composite signal after being phase-inverted through the phase-inverter 26 and also the output signal of the frequency divider 12. When the phase-locked loop circuit 1 is in the locked state, the signal derived from the frequency divider 12 is in phase with the first signal $S_p$ contained in the composite signal so that the phase-inverted second signal $-S_u$ is applied through the gate 21 to the adder 24, as the cancelling signal.

It should be noted that the level of the composite signal applied to the system of FIGS. 2 and 4 desirably is kept substantially constant, since the amplitude of the signal derived from the frequency divider 12 is constant irrespective of the level of the composite signal, i.e. irrespective of the level of the first signal $S_p$ contained in the composite signal; otherwise, the fluctuation in the level of the composite signal will cause an imperfect cancelling of the second signal $S_u$ at the adder 24.

Figure 5:
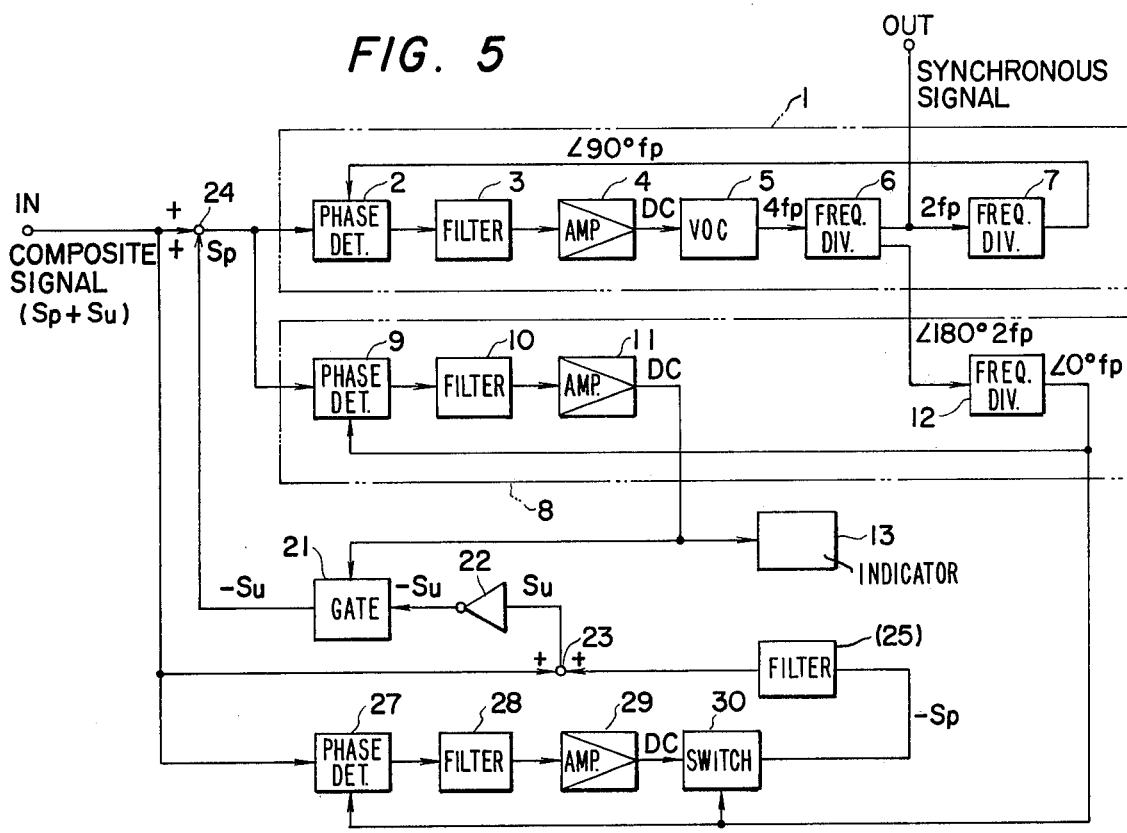

FIG. 5 shows still another example of a synchronous signal generating system according to the present invention, the cancelling signal generating circuit of which system comprises: a phase detector 27; a low-pass filter 28 forming, together with the phase detector 27, a synchronous detecting circuit; a DC-amplifier 29 to which the output of the phase detector 27, is inputted through the low-pass filter 28; a switching circuit 30 for chopping as well as phase-inverting the output of the DC-amplifier 29; an adder 23 for adding the composite signal and the output of the switching circuit 30; a phase inverter 22; and a gate 21 which is assigned to deliver to the adder 24 the output of the phase inverter 22 as the cancelling signal during the state of the phase-locked loop circuit 1 being locked with the first signal $S_p$ of the composite signal.

This cancelling signal generating circuit operates as follows. In the locked state of the phase-locked loop circuit 1, there is delivered from the frequency divider 12 to the phase detector 27 and to the switching circuit 30 a signal which is in phase with the first signal $S_p$, so that the phase detector 27 delivers, through the low-pass filter 28, a DC voltage of a magnitude proportional or equal to the level of the first signal $S_p$ contained in the composite signal which is applied to the phase detector 27. This DC-voltage, after being amplified by the DC-amplifier 29, is chopped synchronously with the first signal $S_p$ and also phase-inverted by the switching circuit 30. Thus, from the switching circuit 30 is delivered an output signal which is in reverse phase with the first signal $S_p$ and has an amplitude equal to that of the first signal $S_p$. The adder 23 adds the composite signal to the output signal of the switching circuit 30, to cancel the first signal $S_p$ component contained in the composite signal. The output signal of the adder 23, i.e. the second signal $S_u$, is then phase-inverted by the phase-inverter to be applied, as the cancelling signal, to the adder 24 through the gate which is now open because of the phase-locked loop circuit 1 being in the locked state. It is needless to say that, in the unlocked state of the phase-locked loop circuit 1, the gate 21 does not deliver the cancelling signal to the adder 24 since it is then closed.

As will be easily understood from the above statement, this example provides such an advantage that it is possible to almost perfectly cancel the second signal $S_u$ of the composite signal which is to be inputted to the phase-locked loop circuit 1 even in case there is a considerably large variation of the level of the composite signal, since the switching circuit 30 is designed to deliver a signal of an amplitude equal to that of the first signal $S_p$ of the composite signal.

Figure 6:
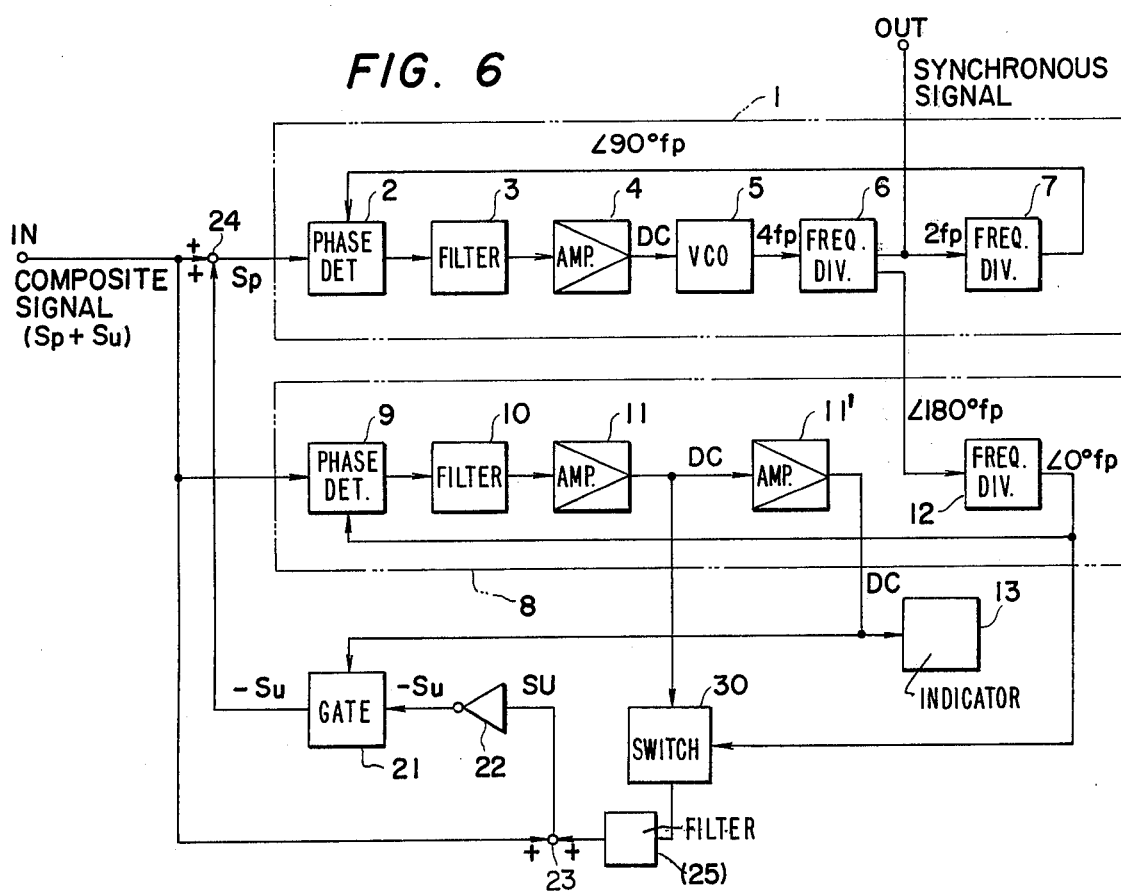

A modification of the system of FIG. 5 is shown in FIG. 6. In this example, the phase-detector 9, the low-pass filter 10 and the DC-amplifier 11 all of which are the elements of the lock-detecting circuit 8 are used to serve as the phase detector 27, the low-pass filter 28 and the DC-amplifier 29 in FIG. 5, respectively, for the purpose of decreasing the number of the constituting elements of the cancelling signal generating circuit. The output of the DC-amplifier 11 is applied to the switching circuit 30 and, either through an additional DC-amplifier 11' or directly from this switching circuit 30, to the indicator 13. The operation of this instant example is similar to that of the example of FIG. 5.

I claim:
1. A system for generating a synchronous signal which is synchronous with a first signal contained in a composite signal consisting of said first signal and at least one second signal having a frequency different from that of said first signal, comprising:

a phase-locked loop circuit which, upon its receipt of at least said first signal through a first means, is locked with said first signal received and which thereby generates said synchronous signal, said phase-locked loop circuit comprising:

a voltage-controlled type oscillator which controls its oscillation frequency by a control voltage applied thereto, and a first phase-detector circuit for receiving at least said first signal through said first means and receiving a feedback signal which is generated from the output signal of said oscillator and which has the same frequency as that of said output signal of said oscillator, and for thereby delivering a first DC-voltage of a value corresponding to the phase difference between said first signal and said feedback signal, said oscillator having applied thereto, as said controlling voltage, a second DC-voltage of a value substantially proportional to that of said first DC-voltage and thereby having its oscillation frequency controlled, so that the phase difference between said first signal and said feedback signal is kept at 90°, said synchronous signal being associated, in phase, with said output signal of said oscillator; and a second means for receiving at least said composite signal and for thereby generating a cancelling signal;

said first means receiving said composite signal and said cancelling signal to thereby cancel, by said cancelling signal, said signal contained in said composite signal;

whereby said first signal carrying substantially none of said second signal is delivered by said first means to said phase-locked loop circuit;

a third means for receiving said composite signal and a third signal associated, in phase and frequency, with the output signal of said oscillator to generate a fourth signal when the phase difference between said first signal and said feedback signal is 90°, said second means including: a fourth means for receiving a signal associated, in phase and frequency, with the output signal of said oscillator to deliver a fifth signal whose amplitude is substantially equal to that of said first signal and whose phase is inverse of that of said first signal when the phase difference between said first and said feedback signal is 90°;

an adder for receiving said composite signal and said fifth signal and for thereby adding these two signals together;

a phase inverter for inverting the output signal of said adder; and a gate connected in series between said first means and said phase inverter, said gate being rendered conductive upon receipt of said fourth signal to thereby deliver, as said cancelling signal, the output of said phase inverter to said first means.

2. A system according to claim 1, in which:
said third means includes: a second synchronous detector circuit for receiving said composite signal and said third signal to generate said fourth signal.

3. A system for generating a synchronous signal which is synchronous with a first signal contained in a composite signal consisting of said first signal and at least one second signal having a frequency different from that of said first signal, comprising:

a phase-locked loop circuit which, upon its receipt of at least said first signal through a first means, is locked with said first signal received and which thereby generates said synchronous signal, said phase-locked loop circuit comprising:

a voltage controlled type oscillator which controls its oscillation frequency by a control voltage applied thereto, and a first phase-detector circuit for receiving at least said first signal through said first means and a feedback signal which is generated relying on the output signal of said oscillator and which has the same frequency as that of said output signal of said oscillator, and for thereby delivering out a first DC-voltage of a value corresponding to the phase difference between said first signal and said feedback signal, said oscillator being applied with, as said controlling voltage, a second DC-voltage of a value substantially proportional to that of said first DC-voltage and thereby being controlled of its oscillation frequency, so that the phase difference between said first signal and said feedback signal is kept at 90°, said synchronous signal being one associated, in phase, with said output signal of said oscillator; and a second means for receiving at least said composite signal and for thereby generating a cancelling signal, said first means receiving said composite signal and said cancelling signal to thereby cancel, by said cancelling signal, said second signal contained in said composite signal, whereby said first signal carrying substantially none of said second signal is delivered by said first means to said phase-locked loop circuit a third means for receiving said composite signal and a third signal associated, in phase and frequency, with the output signal of said oscillator to deliver a fourth signal during the period that the frequency difference between said first signal and said feedback signal is 90°, said second means including: a fourth means for receiving a signal associated, in phase and frequency, with the output signal of said oscillator to generate a fifth signal, this fifth signal being synchronous with said first signal during the period that the phase difference between said first signal and said feedback signal is 90°; a synchronous detector circuit for receiving said composite signal and said fifth signal to generate a third DC-voltage, the magnitude of said third DC-voltage being substantially proportional to the level of said first signal during the period that the phase difference between said first signal and said feedback signal is 90°; an fifth means for chopping, synchronously with said fifth signal, said third DC-voltage to form a pulse train having an amplitude proportional to the magnitude of said third DC-voltage and having an inverse phase relative to said fifth signal; an adder for adding said composite signal and said pulse train derived by said fifth means to each other; a phase inverter; and a gate for receiving the output signal of said adder which has been phase-inverted by said phase inverter, said gate being rendered conductive, upon its receipt of said fourth signal, to deliver, as said cancelling signal, the output of said phase inverter to said first means.

4. A system according to claim 3, in which:
said third means includes a second synchronous detector circuit for receiving said composite signal and said third signal to generate said fourth signal.

5. A system for use in an FM receiver and for generating a synchronous signal which is synchronous with a first signal contained in a composite signal consisting of said first signal and a second signal having a frequency different from that of said first signal, characterized in that said first signal is a pilot signal and that said second signal includes a main-channel signal and a sub-channel signal, said system comprising:
a phase-locked loop circuit which, upon receipt of at least said first signal through a first means, is locked with said first signal received and which thereby generates said synchronous signal, second means for receiving at least said composite signal for thereby generating a cancelling signal, and a gate connected in series between said first means and second means and being rendered conductive upon receipt of said composite signal to thereby deliver, as said cancelling signal, the output of said second means to said first means, said first means receiving said composite signal and said cancelling signal to thereby cancel, by said cancelling signal, said second signal contained in said composite signal, whereby said first signal carrying substantially none of said second signal is delivered by said first means to said phase-locked loop circuit.

6. A system according to claim 5, wherein said loop circuit includes:
a voltage-controlled type oscillator which controls its oscillation frequency by a control voltage applied thereto, a first phase-detector circuit for receiving at least said first signal through said first means and a feedback signal which is generated from the output signal of said oscillator and which has the same frequency as that of said output signal of said oscillator, and for thereby delivering out a first DC-voltage of a value corresponding to the phase difference between said first signal and said feedback signal, said oscillator having applied thereto as said controlling voltage, a second DC-voltage of a value substantially proportional to that of said first DC-voltage and thereby having its oscillation frequency controlled so that the phase difference between said first signal and said feedback signal is kept at 90°, said synchronous signal being one associated, in phase, with said output signal of said oscillator, and a third means for receiving said composite signal and a third signal associated, in phase and frequency, with the output signal of said oscillator to generate a fourth signal when the phase difference between said first signal and said feedback signal is 90°, and said gate being rendered conductive upon receipt of said fourth signal to thereby deliver, as said controlling signal, the output of said second means to said first means.

* * * * *